United States Patent
Rolfson

[19]

[11] Patent Number: 6,060,378
[45] Date of Patent: May 9, 2000

[54] SEMICONDUCTOR BONDING PAD FOR BETTER RELIABILITY

[75] Inventor: J. Brett Rolfson, Boise, Id.

[73] Assignee: Micron Technology, Inc., Boise, Id.

[21] Appl. No.: 09/195,885

[22] Filed: Nov. 19, 1998

Related U.S. Application Data

[63] Continuation of application No. 08/552,755, Nov. 3, 1995, abandoned.

[51] Int. Cl.$^7$ .................................................... H01L 21/44
[52] U.S. Cl. .......................... 438/612; 438/613; 438/614; 438/615; 438/616; 438/617; 438/665; 438/666; 438/669; 438/672
[58] Field of Search ..................................... 438/612–617, 438/666, 672, 665, 669

[56] References Cited

U.S. PATENT DOCUMENTS

| | | | |
|---|---|---|---|
| 3,697,318 | 10/1972 | Feinberg et al. | 438/612 |
| 5,196,377 | 3/1993 | Wagner et al. | 437/225 |
| 5,226,446 | 7/1993 | Chang et al. | 438/612 |
| 5,294,295 | 3/1994 | Gabriel | 438/612 |
| 5,336,929 | 8/1994 | Hayashi | 438/612 |
| 5,436,198 | 7/1995 | Shibata | 438/612 |
| 5,445,994 | 8/1995 | Gilton | 438/612 |
| 5,731,243 | 3/1998 | Peng et al. | 438/612 |

OTHER PUBLICATIONS

Wolf, "Silicon Processing for the VLSI Era: vol. 2—Process Integration," pp. 273–275, 377, Lattice Press (1990).

*Primary Examiner*—Charles Bowers
*Assistant Examiner*—David A. Zarneke
*Attorney, Agent, or Firm*—Workman, Nydegger & Seeley

[57] ABSTRACT

Improved bonding pads in an integrated circuit are provided, each having a first bonding pad layer comprising a portion of a top metal layer, and a top bonding pad layer comprising a remaining portion of a deposited bonding pad metal fill layer. The thickness of the bonding pad is greater than the thickness of the top metal layer. The composition of the top bonding pad layer may be different from the top metal layer, so that the composition of each may be independently optimized. A method for forming the improved bonding pads includes deposition of a bonding pad metal fill layer to fill openings in a passivation layer over the first bonding pad layers, and removal of the bonding pad metal fill layer over the passivation layer. An alternative method removes the bonding pad metal fill layer only at areas immediately surrounding locations of the bonding pads, leaving top bonding pad layer and a metal radiation shield layer. Intermediate layers may be employed to improve resistivity or other characteristics of the bonding pads.

28 Claims, 3 Drawing Sheets

SEMICONDUCTOR BONDING PAD FOR BETTER RELIABILITY

RELATED APPLICATIONS

This is a continuation of U.S. patent application Ser. No. 08/552,755, filed on Nov. 3, 1995 now abandoned, titled "Improved Semiconductor Bonding Pad for Better Reliability" which is incorporated herein by reference.

BACKGROUND OF THE INVENTION

1. The Field of the Invention

The present invention relates to the manufacture of semiconductor devices. More particularly, the present invention is directed to novel bonding pads for integrated circuit devices for improved reliability, and methods for forming the same.

2. The Relevant Technology

In conventional semiconductor technology, bonding pads are formed in an integrated circuit as part of a top metal layer. The top metal layer is deposited and then patterned to form runners and bonding pads. Passivation layers are then deposited over the top metal layer and patterned, leaving openings in the passivation layers over the bonding pads. Later, during packaging of individual die, each bonding pad has an end of a wire bonded thereto through application of heat, pressure, sonic energy, other forms of energy, or a combination thereof. An opposite end of each wire is bonded to an inner portion of a package lead.

The reliability of the bonding process is particularly critical since the bonding process occurs so late in the production cycle. Die being packaged have typically already been tested and sorted. Any problems in the wire bonding process thus impact only good die, and do so only after substantial investment in the production thereof.

Secure, reliable bonding of the wire to the bonding pad requires that the bonding pad be formed of metals compatible with the bonding process. Aluminum and aluminum alloys are typically employed to achieve the most reliable bonds. Reliable bonding further requires a certain minimum bonding pad thickness, so that sufficient material is present to form a secure bond.

An undesirable effect of the current technology is that the above requirements for reliable wire bonding effectively limit the minimum feature size of the top metal layer. Metal layers having sufficient thickness for reliable bonds are typically too thick to be easily patterned at higher resolutions. A relatively thick metal layer requires a relatively thick layer of photoresist to withstand the longer etch required to remove the thick metal layer. But a very high resolution exposure is generally obtained only in conjunction with a shallow depth of focus which is insufficient to provide high resolution exposure throughout a thick photoresist layer. Also, as the aspect ratio of the metal lines increases, the difficulty of adequately cleaning and filling between the lines, resulting in decreasing reliability with increasing thickness. Further, aluminum and aluminum alloys are more susceptible to electromigration than some other metals, which prevents the use of very thin metal lines.

SUMMARY AND OBJECTS OF THE INVENTION

An object of the present invention is to provide improved semiconductor bonding pads for increased bond reliability.

Another object of the present invention is to provide improved semiconductor bonding pads for increased device reliability due to greater resistance of the finished die to mobile ionic contamination.

Another object of the present invention is to provide highly reliable wire bonding pads and a tight pitch top metal level in a single integrated circuit.

Another object of the present invention is to minimize electromigration in a top metal level and maximize wire bond reliability in a single integrated circuit.

Another object of the present invention is to optimize resistivity in a top metal level and optimize wire bond reliability in a single integrated circuit.

Another object of the present invention is to decrease the soft error rate of an integrated circuit.

Another object of the present invention is to improve reliability of the metalization of an integrated circuit by the use of tight pitch single level metalization.

Another object of the present invention is to provide practical and reliable processes for achieving the foregoing objects.

In accordance with a preferred process of the present invention, a top metal layer of an integrated circuit semiconductor wafer is deposited and patterned, with a portion of the resulting top metal layer forming a first bonding pad layer. A first passivation layer is then deposited over the entire surface of the wafer, followed by a second passivation layer. The first and second passivation layers are then patterned, leaving the first bonding pad layers exposed. A bonding pad metal fill layer is then deposited over the entire wafer surface, and then removed over the first and second passivation layers, resulting in top bonding pad layers formed upon the first bonding pad layers.

The resulting inventive bonding pad is thicker than the top metal layer, and extends upward into the openings in the passivation layers, contacting a sidewall of said openings. The top bonding pad layer contacts the second passivation layer, forming therewith over the first passivation layer a barrier against contamination of the first passivation layer, which is typically less resistant to contamination than the second passivation layer. The top bonding pad layer may also have a different composition than the top metal layer, allowing independent optimization of the characteristics of each.

In another preferred process of the present invention, a raised area surrounding location of the bonding pad is provided in the layers underlying the top metal layer. The processing then proceeds as above, but when the bonding pad metal fill layer is removed, only those portions immediately above the raised area are removed, resulting in both a top bonding pad layer upon the first bonding pad layer and a metal radiation shield layer over other areas of the wafer surface.

In accordance with the present invention, one or more intermediate layers may also be employed between the first bonding pad layer and the top bonding pad layer to improve resistivity or other characteristics of the bonding pad.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained may be more fully explained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

In the present invention, an improved semiconductor bonding pad is provided having a first bonding pad layer comprising a portion of a top metal layer, and a top bonding pad layer comprising a remaining portion of a deposited bonding pad metal fill layer. The thickness of the bonding pad exceeds the thickness of the runners and other features of the top metal layer by at least the thickness of the top bonding pad layer. The thickness of the bonding pad, which requires a certain minimum thickness for a reliable bond, and the top metal layer, which is preferably thinner than the thickness required for a bonding pad, may thus be independently optimized. The composition of the top bonding pad layer may also be different from the top metal layer, so that the composition of each may be independently optimized. Intermediate layers may be included in the bonding pad between the first bonding pad layer and the top bonding pad layer to improve resistivity or other characteristics of the bonding pad. A metal shield layer may also be formed from the bonding pad metal fill layer.

Figure 1:
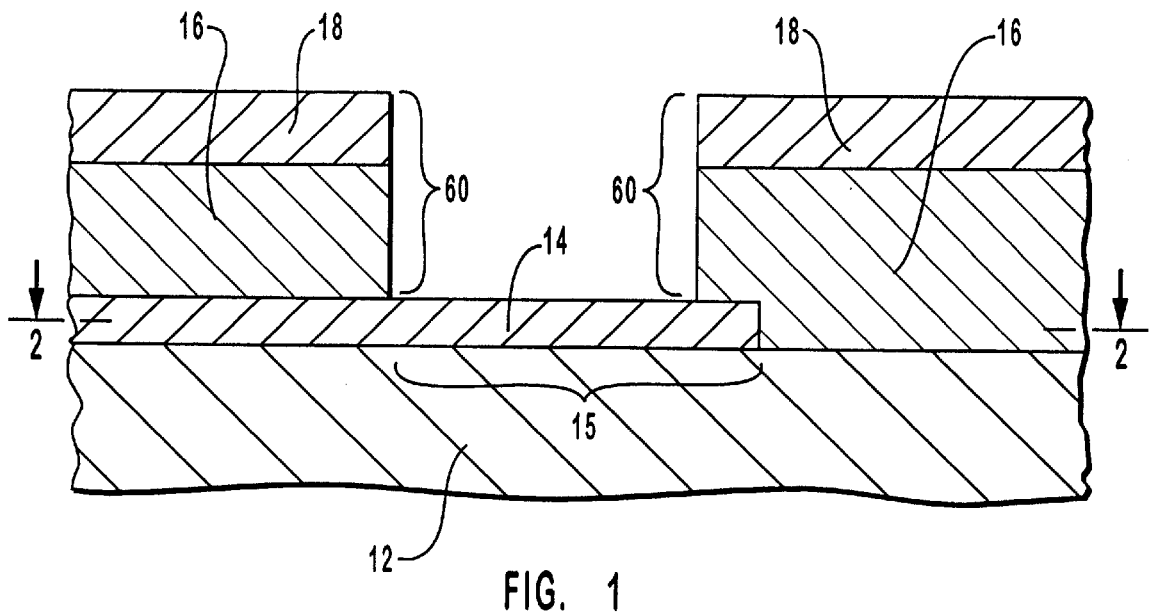
FIG. 1 is a cross section of a portion of a semiconductor wafer upon which the improved bonding pads of the present invention are partially formed.

FIG. 1 is a cross section of a portion of a semiconductor wafer upon which an improved semiconductor bonding pad of the present invention is partially formed. A top metal layer 14 has been deposited over an underlying layer 12. The portion of top metal layer 14 shown may be placed in electrical contact with underlying circuit devices or lower metal layers by an electrically conductive plug. A first passivation layer 16 has been deposited over top metal layer 14 and underlying layer 12. A second passivation layer 18 has been deposited over first passivation layer 16. First and second passivation layers 16, 18 have been patterned, resulting in the removal of first and second passivation layers 16, 18 over a bonding pad area of top metal layer 14. The resulting opening in first and second passivation layers 16, 18 has a sidewall 60.

According to conventional technology, FIG. 1 would represent a finished bonding pad. In the present invention, in contrast, the portion of metal layer 14 underlying the opening in first and second passivation layers 16, 18 represents only a first bonding pad layer 15. In the present invention, at least one additional layer is added to form the completed bonding pad, as will be explained below.

Figure 2:
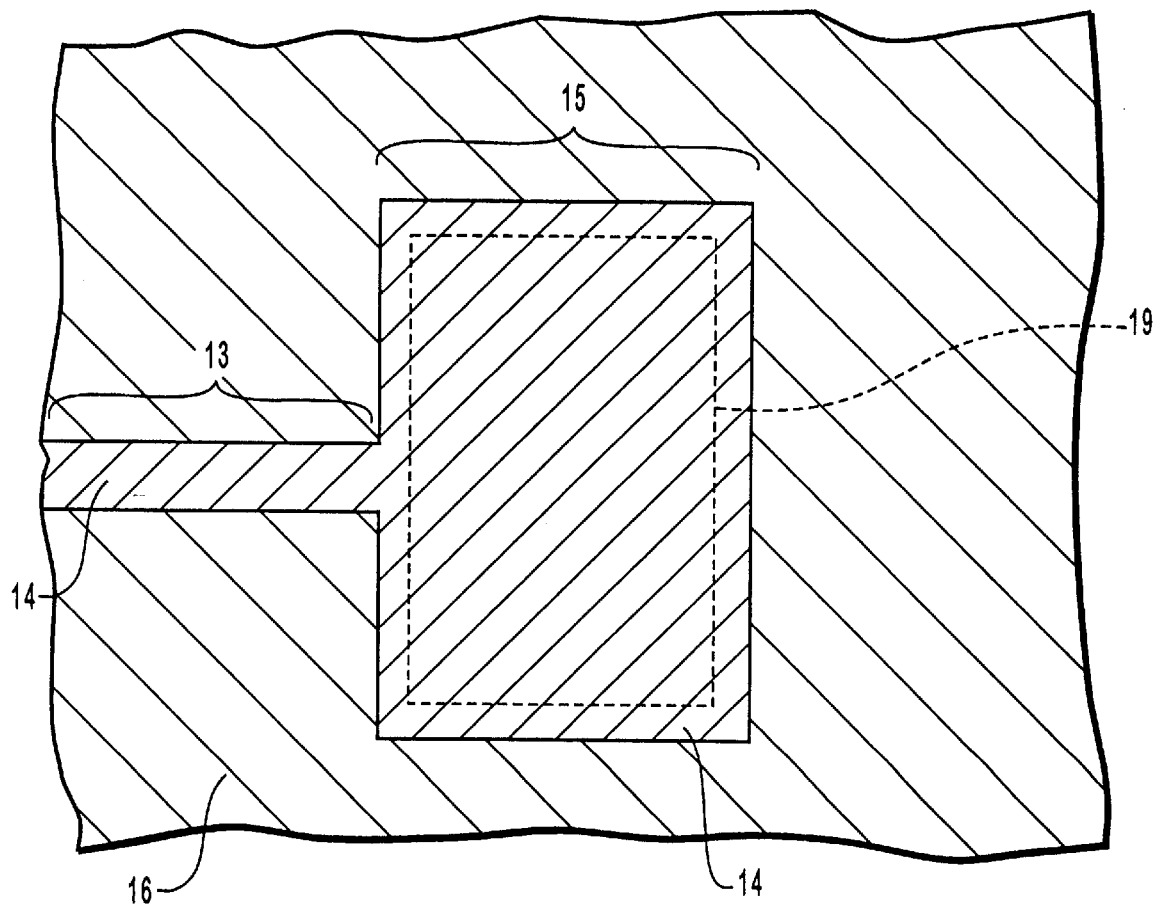
FIG. 2 is a plan view of FIG. 1 taken along the section line II-II.

FIG. 2 is a plan view of the structure shown in FIG. 1 taken along section line 2—2. FIG. 2 shows a top down view of first passivation layer 16 and top metal layer 14. From FIG. 2, top metal layer 14 is seen to include a runner 13 and a first bonding pad layer 15. Opening 19 in first passivation layer 16 and second passivation layer 18 (shown in FIG. 1) is also shown, in broken outline superimposed over first bonding pad layer 15.

According to one presently preferred process for forming the improved bonding pads of the present invention, a bonding pad metal fill layer is deposited directly over the wafer shown in FIG. 1, then the bonding pad metal fill layer is removed over first and second passivation layers 16, 18. Application of this process is illustrated in FIGS. 2 and 3.

Figure 3:
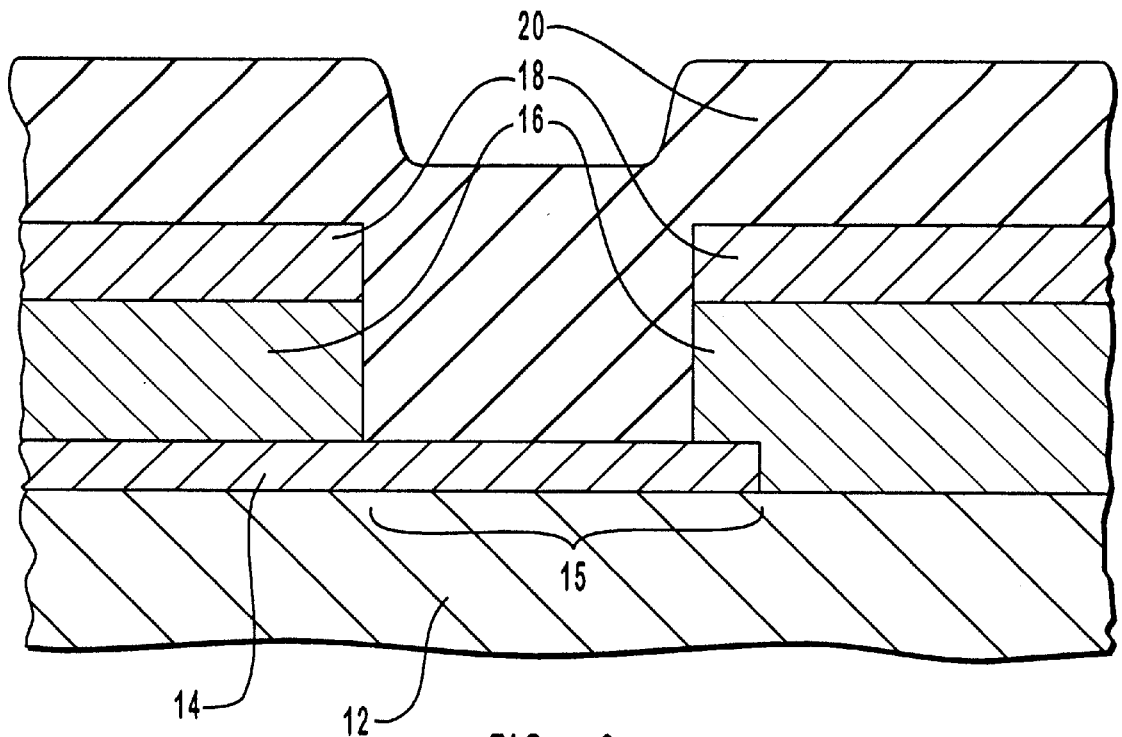
FIG. 3 is the cross section of FIG. 1 after a bonding pad metal fill layer has been deposited thereon.

FIG. 3 shows the cross section of FIG. 1 after deposition of a bonding pad metal fill layer 20. Bonding pad metal fill layer 20 has been deposited over the entire wafer surface and has filled the opening in first and second passivation layers 16, 18, contacting metal layer 14 at first bonding pad layer 15. Bonding pad metal fill layer 20 may be deposited by any conventional process, including but not limited to sputtering, CVD, evaporation and the like.

Figure 4:
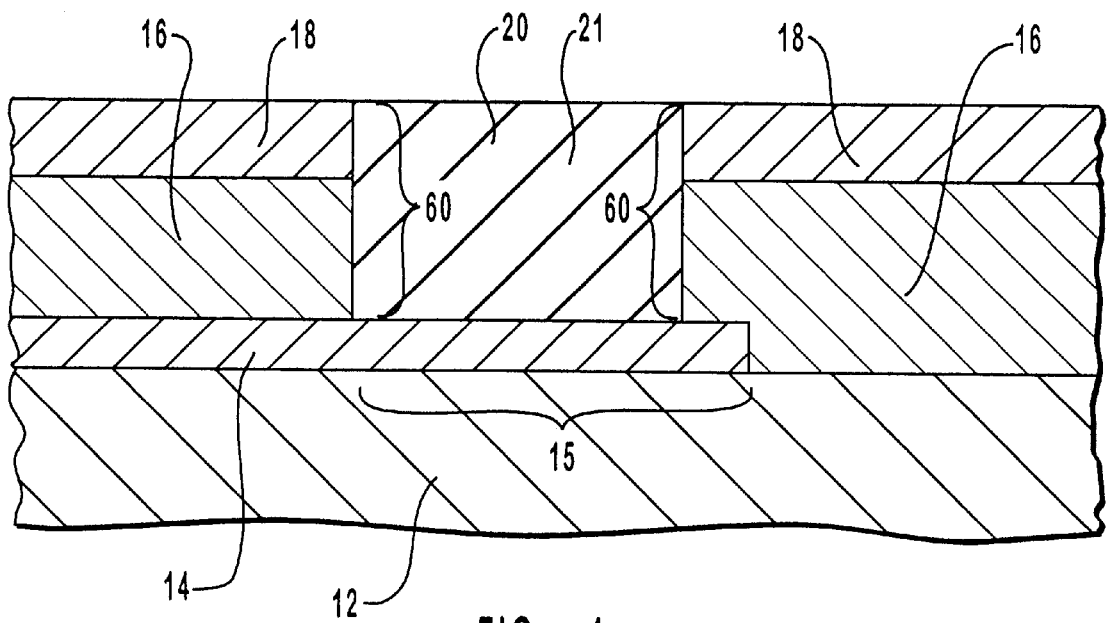
FIG. 4 is the cross section of FIG. 3 after removal of the bonding pad metal fill layer over a top passivation layer, showing a finished improved bonding pad of the present invention.

FIG. 4 shows the cross section of FIG. 3 after removal of the portions of bonding pad metal fill layer 20 overlying second passivation layer 18. The remaining portion of bonding pad metal fill layer 20 forms a top bonding pad layer 21 having a side wall which contacts side wall 60 of the opening in first and second passivation layers 16, 18.

Removal of the portions of bonding pad metal fill layer 20 overlying first and second passivation layers 16, 18 may be accomplished by any conventional process, but chemical mechanical polishing (CMP) is presently preferred. Second passivation layer 18 is typically and preferably formed of silicon nitride, which with known techniques provides a good stop for CMP. The CMP may be performed slightly beyond the point of contact with second passivation layer 18 to ensure that all unwanted metal is removed. Such over polishing also results in the slight dishing of the upper surface of the remaining portion of bonding pad metal fill layer 20, as shown in FIG. 4.

The improved bonding pad of the present invention shown in FIG. 4 provides many advantages over conventional bonding pads. One advantage is that the bonding pad shown in FIG. 4 may be significantly thicker than top metal layer 14 alone. The bonding pad of FIG. 4 includes both first bonding pad layer 15, which has the thickness of top metal layer 14, and top bonding pad layer 21 which may be up to several times the thickness of top metal layer 14. The thickness of top metal layer 14 is preferably within the range of about 2,000 Angstroms to about 12,000 Angstroms, and most preferably from about 3,000 Angstroms to about 6,000 Angstroms, while the thickness of top bonding pad layer 21 is preferably within the range of about 5,000 Angstroms to about 20,000 Angstroms. Thus the present invention provides for a thick bonding pad for improved bond reliability, while simultaneously allowing a thin top metal layer which results in tighter pitch capability and improved top metal layer reliability.

Another advantage of the improved bonding pad of the present invention shown in FIG. 4 is that top metal layer 14 and bonding pad metal fill layer 20 need not have identical compositions. Thus the composition of top metal layer 14 may be optimized for best resistance to electromigration and least resistance contacts to underlying conductors, while bonding pad metal fill layer may be optimized for best bond reliability. For example, tungsten or a tungsten alloy could be used as the top metal layer, with its greater resistance to electromigration allowing for a tighter pitch than possible with aluminum and aluminum alloys, while aluminum or an aluminum alloy could be used for bonding pad metal fill layer 20 to ensure a reliable bond.

The improved bonding pad of the present invention finds particularly advantageous application in a single level metalization system. The above noted advantages allow a very tight pitch top level metal, such that even dense integrated circuits typically requiring multiple level metalization may be completely metalized in a single level. Reducing typical multiple layer metalization schemes to a single level increases yield and decreases production times and wafer inventories. Each reference to a top metal layer or level in the specification or claims thus should be understood to include within the scope thereof a single metal layer or level, which of necessity is also then the top layer or level.

Yet another advantage of the improved bonding pads of the present invention is provided by the contact of top bonding pad layer 21 with second passivation layer 18 as seen in FIG. 4. Second passivation layer 18 typically and preferably comprises silicon nitride, with a thickness preferably within the range of about 2,000 Angstroms to about 10,000 Angstroms. Silicon nitride is hard, durable, and relatively impervious to many contaminants and chemical agents. Silicon nitride films tend to exhibit high stress, however. An important purpose of first passivation layer 16 is thus to isolate the underlying structures from the stress of the silicon nitride film of second passivation layer 18. An undoped oxide of silicon is typically employed for this purpose, with a thickness preferably within the range of about 4,000 Angstroms to about 15,000 Angstroms. But undoped silicon oxides readily conduct ionic contamination, and even doped silicon oxides allow contamination to penetrate more easily than silicon nitride. Thus the present invention provides a significant advantage by sealing off first passivation layer 16 from any external exposure at the bonding pad site, as shown in FIG. 4. This contrasts with FIG. 1, which corresponds to conventional bonding pads, in which first passivation layer 16 is exposed at a portion of sidewall 60.

Another presently preferred process for producing the improved bonding pads of the present invention is essentially identical to the process outlined above, except that raised areas surrounding locations of the bonding pads are provided in underlying layers. The required topography can be provided, for example, in a field oxide layer or in a polysilicon layer somewhere directly below the desired location. The process then follows as before, with deposition and patterning of a top metal layer, deposition of a first passivation layer, deposition of a second passivation layer, removal of the first and second passivation layers over bonding pad locations, and deposition and removal by CMP of a bonding pad metal fill layer. The bonding pad metal fill layer, however, is completely removed only over the raised areas, and not over the entire second passivation layer.

Figure 5:
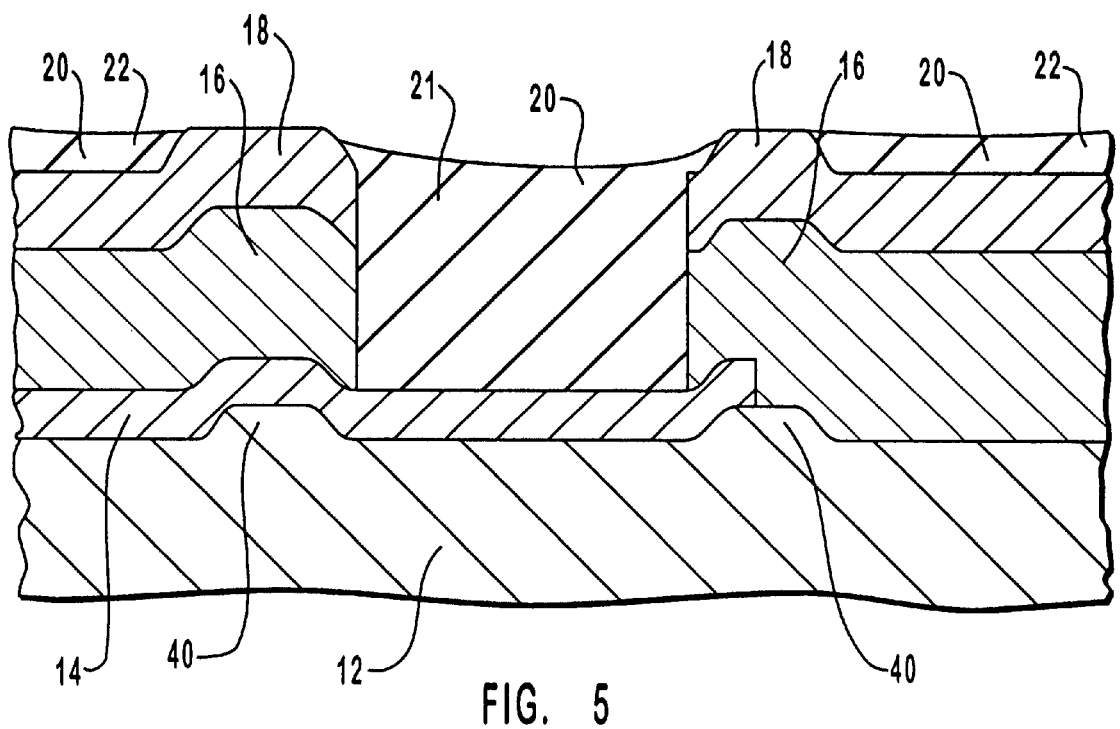
FIG. 5 is a cross section of a portion of a semiconductor wafer having thereon an alternate embodiment of the bonding pads of the present invention including therewith a metal shield layer.

The result of this process is shown in FIG. 5. Raised areas 40 are provided in underlying layer 12. As a result, the CMP removes bonding pad metal fill layer 20 over raised areas 40, but stops on second passivation layer 18 over raised areas 40, resulting in top bonding pad layer 21 and metal shield layer 22. Metal shield layer 22 helps shield the integrated circuit device below it from radiation, improving the soft error rate of the device. This advantage is provided by the structure shown in FIG. 5 in addition to those advantages discussed above with respect to the structure shown in FIG. 4.

The first bonding pad layers and top bonding pad layers of the bonding pads of the present invention need not consist of different materials. The bonding pads of the present invention may also be comprised of more than two layers. For example, one or more intermediate layers may be deposited between the first bonding pad layer and the top bonding pad layer, as illustrated in FIG. 6.

Figure 6:
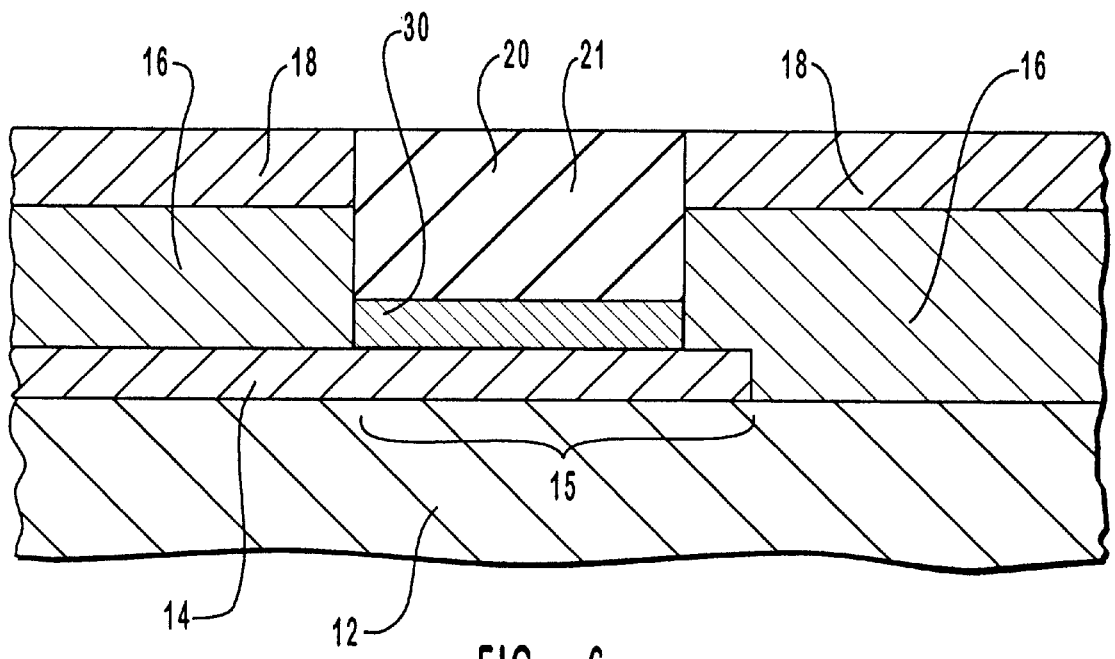
FIG. 6 is a cross section of a portion of a semiconductor wafer having thereon an alternate embodiment of the bonding pads of the present invention.

In FIG. 6, a thin alloying layer 30 has been deposited over a first bonding pad layer 15. Top bonding pad layer 21 was then formed on alloying layer 30 from bonding pad metal fill layer 20. Where first bonding pad layer 15 comprises tungsten and top bonding pad layer 21 comprises aluminum, titanium or titanium nitride may for example be used as thin alloying layer 30 to improve the electrical contact and resistivity between first bonding pad layer 15 and top bonding pad layer 21.

The present invention may be embodied in other specific forms without departing from its spirit or essential characteristics. The described embodiments are to be considered in all respects only as illustrated and not restrictive. The scope of the invention is, therefore indicated by the appended claims rather than by the foregoing description. All changes which come within the meaning and range of equivalency of the claims are to be embraced within their scope.

What is claimed and desired to be secured by United States Letters Patent is:

1. A method for providing an improved bonding pad, said method comprising:

providing a substrate and a raised structure projecting therefrom;

forming a top metal layer conformingly upon the substrate and the raised structure;

forming a first passivation layer conformingly on the top metal layer;

forming a second passivation layer conformingly on the first passivation layer;

forming a recess within the first passivation layer and the second passivation layer and terminating at the top metal layer;

forming a bonding pad metal fill layer within the recess and conformingly on the second passivation layer;

forming a first portion of the bonding pad metal fill layer that is separated by the second passivation layer from a second portion of the bonding pad metal fill layer.

2. The method as defined in claim 1, wherein forming a bonding pad metal fill layer within the recess comprises:

forming the bonding pad metal fill layer within the recess in contact with the top metal layer.

3. The method as defined in claim 1, wherein forming a recess further comprises:

forming sidewall for said recess that is defined by the first passivation layer and the second passivation layer.

4. The method as defined in claim 3 wherein:

the sidewall for said recess has a planar interface with the bonding pad metal fill layer;

the sidewall for said recess has a linear interface with the top metal layer.

5. The method as defined in claim 3, wherein:

the sidewall for said recess is perpendicular to the top metal layer.

6. The method as defined in claim 1, wherein providing a substrate and a raised structure projecting therefrom comprises:
forming at least one of a field oxide layer and a polysilicon layer.

7. The method as defined in claim 1, wherein:
the first portion of the bonding pad metal fill layer is within the recess; and
the second portion of the bonding pad metal fill layer is adjacent to an exposed portion of the second passivation layer that is over the raised structure.

8. The method as defined in claim 1, wherein forming a first portion of the bonding pad metal fill layer that is separated by the second passivation layer from a second portion of the bonding pad metal fill layer comprise:
planarizing the bonding pad metal fill layer such that the bonding pad metal fill layer covers the second passivation except over the raised structure where the second passivation over the raised structure is exposed.

9. The method as defined in claim 1, wherein the first passivation layer is composed of an oxide of silicon and the second passivation layer is composed of silicon nitride.

10. The method as defined in claim 1, wherein:
forming a top metal layer conformingly upon the substrate and the raised structure further comprises:
patterning said top metal layer to form an elongated runner extending to a first bonding pad layer;
forming a recess within the first passivation layer and the second passivation layer and terminating at the top metal layer further comprises:
forming said recess to expose said first bonding pad layer;
forming a bonding pad metal fill layer within the recess and conformingly on the second passivation layer further comprises:
forming said bonding pad metal fill layer upon the exposed first bond pad metal layer.

11. The method as defined in claim 1, wherein:
the thickness of said top metal layer is in the range of about 2,000 Angstroms to about 12,000 Angstroms; and
the thickness of the bonding pad metal fill layer is in the range of about 5,000 Angstroms to about 20,000 Angstroms.

12. The method as defined in claim 1, wherein:
the first passivation layer and the second passivation layer are composed of different electrically insulative materials;
the top metal layer and the bonding pad metal fill layer are composed of different electrically conductive materials.

13. The method as defined in claim 1, wherein:
said top metal layer comprises tungsten; and
said bonding pad metal fill layer comprises aluminum.

14. The method as defined in claim 1, wherein:
forming a top metal layer conformingly upon the substrate and the raised structure further comprises:
forming an alloying layer over said top metal layer;
forming a bonding pad metal fill layer within the recess and conformingly on the second passivation layer further comprises:
forming said bonding pad metal fill layer upon said alloying layer.

15. The method as defined in claim 14, wherein said alloying layer comprises titanium.

16. The method as defined in claim 14, wherein alloying layer comprises titanium nitride.

17. A method for providing an improved bonding pad, said method comprising:
providing a substrate and a raised structure projecting therefrom;
forming a top metal layer conformingly upon the substrate and the raised structure;
forming a first electrically insulative layer conformingly on the top metal layer;
forming a second electrically insulative layer conformingly on the first electrically insulative layer;
forming a recess within the first electrically insulative layer and the second electrically insulative layer and terminating at the top metal layer;
forming a bonding pad metal fill layer within the recess and conformingly on the second passivation layer;
planarizing the bonding pad metal fill layer such that the bonding pad metal fill layer covers the second passivation except over the raised structure where the second passivation layer is exposed.

18. The method as defined in claim 17, wherein planarizing the bonding pad metal fill layer comprises:
a chemical mechanical polishing process.

19. A method for providing an improved bonding pad, said method comprising:
providing a substrate and a raised structure projecting therefrom;
forming a top metal layer conformingly upon the substrate and the raised structure;
forming a first electrically insulative layer conformingly on the top metal layer;
forming a second electrically insulative layer;
forming a recess within the first electrically insulative layer and the second electrically insulative layer and terminating at the top metal layer;
forming a bonding pad metal fill layer within the recess and conformingly on the second passivation layer;
removing a portion of the bonding pad metal fill layer that is over the raised structure so as to expose a portion of the second electrically insulative layer that is over the raised structure.

20. The method as defined in claim 19, wherein removing a portion of the bonding pad metal fill layer comprises:
planarizing the bonding pad metal fill layer.

21. The method as defined in claim 20, wherein planarizing the bonding pad metal fill layer comprises:
a chemical mechanical polishing process.

22. A method for providing an improved bonding pad, said method comprising:
providing a substrate and a raised structure projecting therefrom;
forming a top metal layer conformingly upon the substrate and the raised structure;
forming a first passivation layer conformingly on the top metal layer:
forming a second passivation layer conformingly on the first passivation layer;
forming a recess within the first passivation layer and the second passivation layer and terminating at the top metal layer;
forming a bonding pad metal fill layer within the recess and conformingly on the second passivation layer;

planarizing the bonding pad metal fill layer to:
> expose a portion of the second passivation layer that is over the raised structure;
>
> leave the bonding pad metal fill layer covering the second passivation layer except upon the exposed portion of the second passivation layer that is over the raised structure;
>
> form a first portion of the bonding pad metal fill layer that is separated by the exposed portion of the second passivation layer that is over the raised structure from a second portion of the bonding pad metal fill layer.

23. The method as defined in claim 22, wherein:

the first passivation layer and the second passivation layer are composed of different electrically insulative materials;

the top metal layer and the bonding pad metal fill layer are composed of different electrically conductive materials.

24. A method for providing an improved bonding pad, said method comprising:

> providing a substrate and a raised structure projecting therefrom, said raised structure being selected from the group consisting of a field oxide layer and a polysilicon layer;
>
> forming a top metal layer composed of a refractory metal conformingly upon the substrate and the raised structure, wherein said top metal layer forms an elongated runner extending to a first bonding pad layer;
>
> forming a first passivation layer composed of an oxide of silicon and having a thickness in the range of about 2,000 Angstroms to about 12,000 Angstroms conformingly on the top metal layer;
>
> forming a second passivation layer composed of silicon nitride and having a thickness in the range of about 5,000 Angstroms to about 20,000 Angstroms conformingly on the first passivation layer;
>
> forming a recess within the first passivation layer and the second passivation layer to expose the first bonding pad layer;
>
> forming a bonding pad metal fill layer composed of a metal within the recess in contact with the first bonding pad layer and conformingly on the second passivation layer;
>
> planarizing the bonding pad metal fill layer so as to form a first portion of the bonding pad metal fill layer that is separated by an exposed portion of the second passivation layer that is over the raised structure from a second portion of the bonding pad metal fill layer.

25. The method as defined in claim 24, wherein:

said top metal layer comprises tungsten; and said bonding pad metal fill layer comprises aluminum.

26. The method as defined in claim 24, wherein:

forming a top metal layer further comprises:
> forming an alloying layer over said first bonding pad layer:

forming a bonding pad metal fill layer further comprises:
> forming said bonding pad metal fill layer upon said alloying layer.

27. The method as defined in claim 26, wherein said alloying layer comprises a titanium.

28. The method as defined in claim 26, wherein said alloying layer comprises titanium nitride.

* * * * *

UNITED STATES PATENT AND TRADEMARK OFFICE
CERTIFICATE OF CORRECTION

PATENT NO. : 6,060,378
DATED : May 9, 2000
INVENTOR(S) : David A. Zarneke

It is certified that error appears in the above-identified patent and that said Letters Patent are hereby corrected as shown below:

On the title page, title of the invention, please change "SEMICONDUCTOR" to -- IMPROVED SEMICONDUCTOR -- col. 3, line 39, please change "reliable bond," to -- reliable bond -- col. 5, line 13, please change "pitch top" to -- pitch, top -- col. 5, line 30, please change "agents. Silicon" to -- agents. However, silicon -- col. 5, line 30, please change "stress," to -- stress. -- col. 5, line 31, please change "however. An" to -- An -- col. 6, line 14, please change "15. Top" to -- 15. A top -- col.6, line 18, please change "may for example be" to -- may, for example, be -- col. 8, line 1, please change "wherein alloying" to -- wherein said alloying --

Signed and Sealed this

Twenty-second Day of May, 2001

Attest:

NICHOLAS P. GODICI

Attesting Officer

Acting Director of the United States Patent and Trademark Office